United States Patent [19]

Crouch

[11] 4,135,071

[45] Jan. 16, 1979

[54] VACUUM CIRCUIT INTERRUPTER WITH DISC-SHAPED BERYLLIUM CONTACTS

[75] Inventor: Donald W. Crouch, Newtown Square, Pa.

[73] Assignee: General Electric Company, Philadelphia, Pa.

[21] Appl. No.: 667,742

[22] Filed: Mar. 17, 1976

[51] Int. Cl.$^2$ .......... H10H 1/06

[52] U.S. Cl. .......... 200/275; 200/279; 200/144 B

[58] Field of Search .......... 200/144 B, 275, 279; 228/199

[56] References Cited

U.S. PATENT DOCUMENTS

| | | | |
|---|---|---|---|
| 2,310,658 | 2/1943 | Atlee | 228/199 |
| 3,140,373 | 7/1964 | Horn | 200/144 B |
| 3,270,172 | 4/1965 | Chubb | 200/144 B |
| 3,440,377 | 4/1969 | Wesoloski | 200/144 B |
| 3,441,698 | 10/1966 | Sofianek | 200/144 B |
| 3,903,386 | 9/1975 | Yanagisawa | 200/144 B |

FOREIGN PATENT DOCUMENTS

| | | | |
|---|---|---|---|
| 1025944 | 1/1963 | United Kingdom | 200/144 |

*Primary Examiner*—Robert K. Schaefer
*Assistant Examiner*—Leonard W. Pojunas, Jr.
*Attorney, Agent, or Firm*—William Freedman

[57] ABSTRACT

This vacuum-type circuit interrupter is a high current interrupter rated for interrupting currents of 35,000 amperes r.m.s. or higher. Despite this high current interrupting requirement, each of its disc-shaped contacts can be made from an exceptionally small and thin blank because these contacts are of beryllium and each has a flat surface, without the usual central recess, extending from its center to a perimeter located radially between the outer periphery of the contact and the outer periphery of the inner end of the associated contact rod. On this flat surface of beryllium, contact-engagement occurs and arcs are initiated during interruption. Each contact rod is joined to its associated beryllium contact by means of brazed joint, a portion of which is accommodated in a very shallow recess on the back surface of the contact.

12 Claims, 6 Drawing Figures

VACUUM CIRCUIT INTERRUPTER WITH DISC-SHAPED BERYLLIUM CONTACTS

BACKGROUND

This invention relates to a vacuum-type circuit interrupter rated for interrupting high currents, e.g., 35,000 amperes r.m.s. or higher, and, more particularly, to a vacuum-type circuit interrupter of such rating that has disc-shaped contacts of beryllium.

A vacuum interrupter with disc-shaped contacts of beryllium is able to interrupt exceptionally high currents. But beryllium that is suitable for such duty is quite expensive, and it is therefore important that the disc-shaped contacts be as small as possible in order to limit their cost to a reasonable value. For the same reasons, it is important that the beryllium blank from which each contact is machined be as small as possible.

SUMMARY

A primary object of my invention is to make each disc-shaped beryllium contact of such a configuration that it can be extremely thin and small in diameter and still be able to interrupt very high currents.

Another object is to make each of the disc-shaped beryllium contacts of such a configuration that, even though suitable for very high current interrupting duty, it can be made from an exceptionally small blank of beryllium.

Another object is to construct the beryllium contacts in such a way that, despite the known brittleness of beryllium, the contacts can withstand without mechanical damage the high impact loads that are typically present in high current interrupters, especially at the end of a closing stroke.

In carrying out the invention in one form, I provide a vacuum-type interrupter rated to interrupt currents of 35,000 amperes or higher with any degree of asymmetry up to 1.3. This interrupter comprises a highly evacuated envelope, a pair of contact rods having their inner ends within the evacuated envelope, and a pair of thin disc-shaped contacts primarily of beryllium respectively mounted on the inner ends of the rods. Each contact comprises a central portion with a substantial flat surface primarily of beryllium facing the other contact and located in a predetermined reference plane for engaging the other contact. This flat surface extends radially from the center of the contact to a perimeter located radially between the outer periphery of said contact and the outer periphery of the inner end of the associated contact rod. The contact also has an annular outer portion having a surface facing the other contact and located behind said reference plane so that no contact-engagement normally occurs on said outer portion surface.

BRIEF DESCRIPTION OF DRAWINGS

For a better understanding of the invention, reference may be had to the accompanying drawing, wherein.

DETAILED DESCRIPTION OF PREFERRED EMBODIMENT

Figure 1:
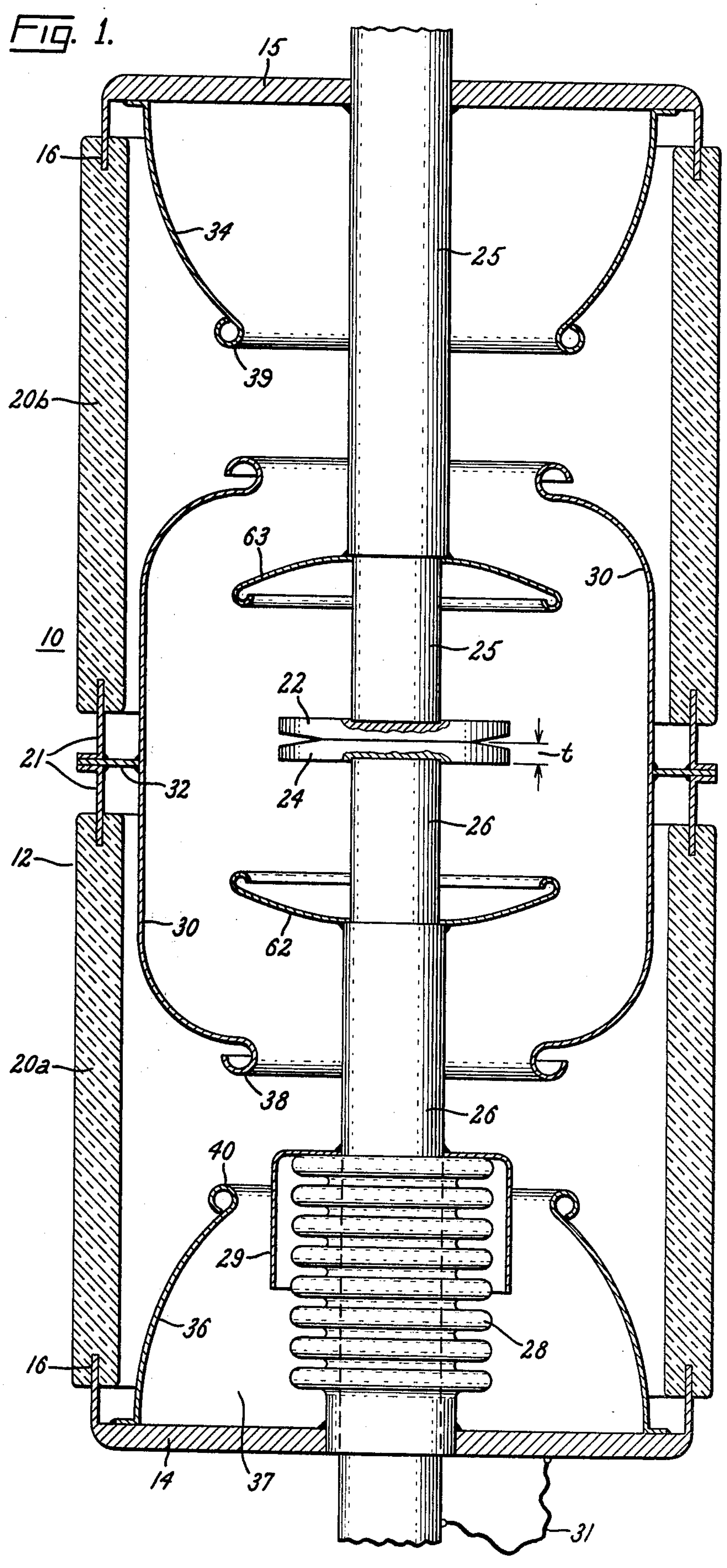
FIG. 1 is a side elevational view, mostly in section, showing a vacuum interrupter embodying one form of the present invention.

Referring now to FIG. 1, the vacuum interrupter shown therein comprises a highly-evacuated envelope 10 comprising a tubular housing 12 primarily of insulating material and a pair of metal end caps 14 and 15 located at opposite ends of the housing and joined thereto by vacuum-tight seals 16. In the illustrated embodiment, the tubular housing 12 comprises two tubular sections 20*a* and 20*b* primarily of insulating material joined together by means of a tubular metal mid-band 21 that has its opposite ends sealed to the tubular sections 20*a* and 20*b*.

Within the housing 12 is a pair of separable disc-shaped contacts 22 and 24. Contact 22 is a stationary contact fixed to a stationary conductive contact rod 25 that extends in sealed relationship through upper end cap 15. Contact 24 is a movable contact supported on a movable contact rod 26 that extends freely through the lower end cap 14. A flexible metal bellows 28 joined at its opposite ends to end cap 14 and contact rod 26 provides a vacuum-tight seal about movable contact rod 26 that allows it to be moved axially without impairing the vacuum within the evacuated envelope 10.

A cup-shaped metal shield 29 fixed to movable contact rod 26 surrounds bellows 28 to protect the bellows from hot arcing products and also to provide electrostatic shielding for the bellows.

The two metal end caps are electrically connected to the contact rods that respectively pass therethrough. The connection between end cap 15 and contact rod 25 is a brazed joint, and the connection between end cap 14 and movable contact rod 26 is through a suitable flexible braid schematically shown at 31.

Opening of the interrupter is effected by driving the movable contact rod 26 downwardly to separate contacts 24 and 22. This establishes an arcing gap between the contacts across which there is developed an arc that persists until about the instant of a natural current zero, at which time the arc is prevented from reigniting by the high dielectric strength of the vacuum.

For condensing the metal vapors generated by the arc, a tubular metal central shield 30 is provided about the arcing gap. This shield 30 normally is electrically isolated from both contacts 22 and 24. It has a radially outwardly-extending mounting flange 32 that is suitably supported on the metal mid-band 21. Metal vapors emitted from the arcing gap by the arc are intercepted and condensed by the shield 30, and this aids the interrupter in recovering its dielectric strength at a current zero as well as protecting the insulating housing from being coated with metal particles deposited from the metal vapors.

To further aid in condensing the metal vapors generated by arcing between the contacts, a pair of end shields 34 and 36 are provided at opposite ends of the envelope 10. Each of these end shields is a tubular metal member suitably joined to and electrically connected to its associated end cap 14 or 15.

To reduce electrical stresses at the ends of the shields 30, 34, and 36, conventional stress-relieving rings 38, 39, and 40 are provided at the ends of the shields. These rings may be formed by spinning over these ends to provide toroids of generally circular cross-section.

The vacuum interrupter of FIG. 1 has a high interrupting current rating, e.g., in excess of 35,000 amperes (r.m.s. interrupting current with any degree of asymmetry up to 1.3). To enable the interrupter to interrupt such high currents, the disc-shaped contacts have been made of beryllium, a material which has exceptional current interrupting ability. In a preferred embodiment of the invention, I utilize for the contacts beryllium formed from a vacuum cast ingot that has been subjected to hot working by extrusion, which contact material is described in more detail and claimed in application Ser. No. 529,178-Kurtz et al, Pat. No. 4,028,514 filed Dec. 3, 1974, and assigned to the assignee of the present invention. Such beryllium has a microstructure characterized by grain boundaries that are substantially free of oxide coating on the interfaces between the grains.

Beryllium (such as that particular beryllium referred to immediately hereinabove) that is suitable for this duty is quite expensive, and it is therefore important that the disco-shaped contacts be as small as possible to limit their cost to a reasonable value. The exceptional interrupting ability of beryllium, especially the particular beryllium referred to above, plays an important role in enabling me to utilize an exceptionally small diameter contact for interrupting these high currents. For example, the diameter of this beryllium contact need be only about 3 inches. Beryllium also has an exceptionally high resistance to contact erosion, and this property plays an important role in enabling me to keep the contact very thin. For example, with disc-shaped contacts such as illustrated made of the above-described beryllium and each having a thickness t of only one-fourth inch, I can repeatedly interrupt currents in excess of 35,000 amperes r.m.s. without allowing the arc to burn through or erode through the thin contacts.

Figure 4:
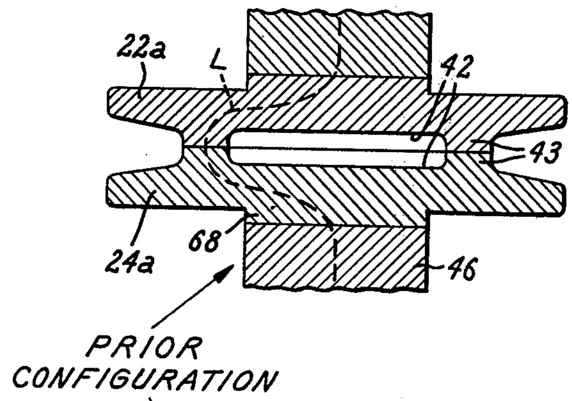
FIG. 4 is a sectional view showing a prior configuration of vacuum interrupter contacts.

Most disc-shaped contacts for high current interrupting duty have a recess in their central region and an annular contact-making region surrounding this recess on which arcs are initiated during interruption. A pair of such prior contacts is illustrated in FIG. 4, where each contact is shown with a central recess 42 and an annular contact-making region 43 surrounding this recess. This annular contact-making region 43 typically has an effective diameter substantially larger than that of the supporting contact rod 46 so that there is a pronounced radially-outwardly-bowing loop in the current path through the contacts. Such current path is shown by the dot-dash line L of FIG. 4. When the contacts of such an interrupter are separated during interruption and an arc is initiated on contact-making regions 43, current through the loop-shaped current path L develops a strong magnetic force for quickly driving the arc radially outward. For high current interruptions such as I am concerned with, the usual approach has been to keep the central recess relatively large so as to accentuate the radially-outwardly bowing loop in the current path L so that a high magnetic force is immediately available to quickly drive the arc off the contact-making regions 43.

I am able in my high current interrupter to dispense with the above-described central recess and to provide each contact with a central region (best shown in FIG. 2) that has a substantially flat surface 50 facing the other contact. When the interrupter is closed, the two contacts engage at points located on this substantially flat surface 50. Tests have shown that for these beryllium contacts, it is unnecessary, even for high current interruptions, to include the above-described central recess and the resulting radially outwardly-bowing loop in the current path. The perimeter of the flat surface 50, it will be noted, is located radially between the outer periphery 51 of a contact and the outer periphery 52 of the inner end of the associated contact rod.

A factor that is believed to contribute to eliminating the need for the central recess is that a high-current beryllium arc in vacuum, immediately after initiation, usually spreads out very quickly and covers practically the whole face of each contact. The beryllium arc behaves in this manner even if initiated by contact separation at the restricted point of last engagement, as in a vacuum interrupter.

In view of this strong tendency for the beryllium arc to spread over the contact face more or less uniformly after initiation, the initial radially-outward magnetic force on the arc that is needed with other contact materials is not required with contacts of beryllium, especially the particular vacuum-cast extruded beryllium referred to hereinabove.

Eliminating the need for the central recess is especially advantageous because the central recess reduces the effective thickness of the contact in the region (shown at 53 in FIG. 2) generally aligned with the periphery 52 of the contact-supporting rod. This region 53 is a crucial one from a mechanical strength viewpoint, especially if the contacts are thin, since this region is subject to high shear forces and high bending forces from loads applied radially outwardly thereof, e.g., impact loads when the contacts strike each other at the end of a closing operation. With no central recess present, I can provide a contact thickness in this region almost equal to the maximum overall thickness of the contact. This added available thickness contributes significantly to increased mechanical strength and resistance to damage by the above-described loads. Beryllium is known to be rather brittle, and this increased resistance to damage from impacts is therefore quite significant.

To limit stresses in the zone 53 to reasonable values, it is highly desirable that the disc-shaped contacts not engage near their outer peripheries. Engagement in such region would result in a large bending moment at the crucial zone 53 near the periphery of the contact rod. To prevent the contacts from engaging near their outer peripheries, each contact is beveled from the perimeter of its flat central region to its outer periphery 51. This bevel results in the annular outer region of the contact having a surface 54 facing the other contact that is located behind the reference plane 55 of FIG. 2 in which the substantially flat central surface 50 is located. The increased space between the contacts made available by the bevels also facilitates interruption since it contributes to improved venting of the arcing products radially outward.

Another factor contributing to reduced thickness for the disc-shaped contacts is that beryllium has excellent anti-weld properties. That is, the contacts have little tendency to weld together with strong welds, even under conditions that are especially conducive to welding, e.g., when closed with high force under arcing conditions. In view of the exceptional anti-weld properties of beryllium, it is unnecessary to provide each contact with a separate contact-making button having anti-weld properties, e.g., as shown and claimed in U.S.

Pat. Nos. 3,182,156-Lee et al. and 3,522,399-Kurtz, both assigned to the assignee of the present invention. This eliminates the need for a groove or the like to accommodate such a button and for the added thickness needed to accommodate such a groove without unduly impairing the mechanical strength of the contact. Also, the fact that the beryllium contacts can always be separated without being required to break a strong weld is advantageous in limiting the forces to which the contacts are subjected upon opening.

Figure 5:
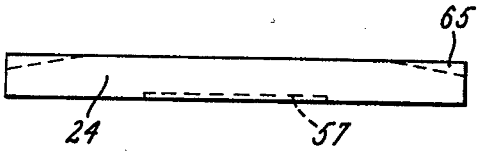
FIG. 5 shows how the contacts of FIGS. 1 and 2 are machined from a blank.
Figure 6:
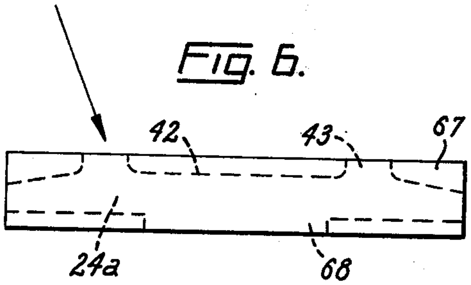
FIG. 6 shows how the contacts of FIG. 4 are machined from a blank.

The absence of a central recess extending out into the region 53 also enables me to reduce the size of the blank from which the disc-shaped contact is machined. If such a centrally-recessed contact was to have the same thickness in the regions 53 as my contact, it would be necessary that the blank from which the contact was machined have extra thickness at least equal to the depth of the recess in order to accommodate the recess. This is illustrated in FIGS. 5 and 6, which respectively show the blanks from which the two compared contacts are machined. Each of these blanks is a cylindrical disc with flat upper and lower faces and a circular periphery. The contact 24 of FIG. 1, which is shown in dotted lines in FIG. 5, is machined from the relatively thin disc 65 of FIG. 5. The contact *24a* of FIG. 6, which is shown in dotted lines in FIG. 6, is machined from a substantially thicker disc 67, shown in FIG. 6. This significant reduction in the thickness of the blank enables me to significantly reduce the cost of the expensive raw material used for the contact. While some of this reduced blank thickness does result from another feature, soon to be described, on the back surface of the contact, a substantial portion results from the above-described configuration of the front disc.

Figure 2:
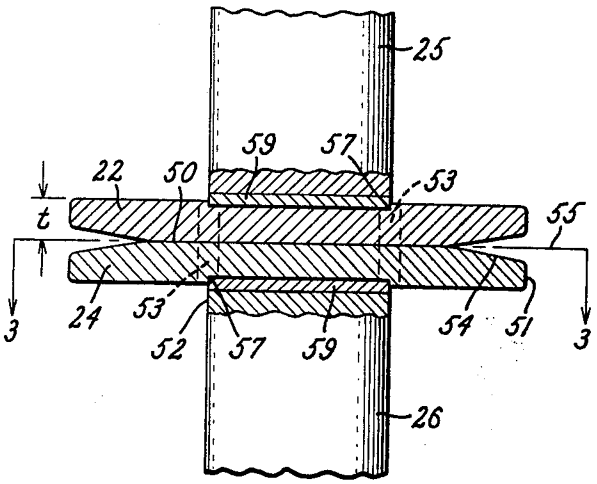
FIG. 2 is an enlarged view of the contacts of the interrupter of FIG. 1.

The contact rods 25 and 26 of FIGS. 1 and 2 are preferably of copper or a copper-base material. The beryllium contacts 22 and 24 are joined to these copper rods by brazed joints, preferably of the type described and claimed in application Ser. No. 625,630-Talento et al, now Pat. No. 4,053,728 filed Oct. 24, 1975, and assigned to the assignee of the present invention. To accommodate each of these brazed joints, a very shallow recess 57, typically one thirty-second inch in depth is provided on the back surface of the contact. Within this recess 57 fits a thin shim 59 of silver and a thin layer of brazing material bonding this silver shim to the beryllium and filling the space in the recess between the shim and the recess surface. The shim projects slightly from the back face of the contact and its back is brazed to the inner end of the associated contact rod. The recess 57 is so shallow that it does not significantly impair the mechanical strength of the contact, particularly since it is filled by the parts of the joint.

Another way of joining a beryllium contact to a copper rod is the electron beam welding process disclosed and claimed in U.S. Pat. No. 3,808,395-Bailey et al, assigned to the assignee of the present invention. This beam-welding process, if used to join a disc-shaped beryllium contact to a copper rod, requires the beryllium contact to have a projecting integral boss on its back face for attachment to the copper rod. Such an integral boss (shown at 68 in FIGS. 4 and 6) is typically machined from the above-described beryllium blank that the contact is formed from, and this requires the blank to have added thickness, as shown in FIG. 6, in order to provide metal for the boss. By using the above-described brazed joint and a shallow recess accommodating the parts of the brazed joint, I can eliminate the need for this added thickness in the blank, thus further contributing to use of a thinner blank.

Figure 3:
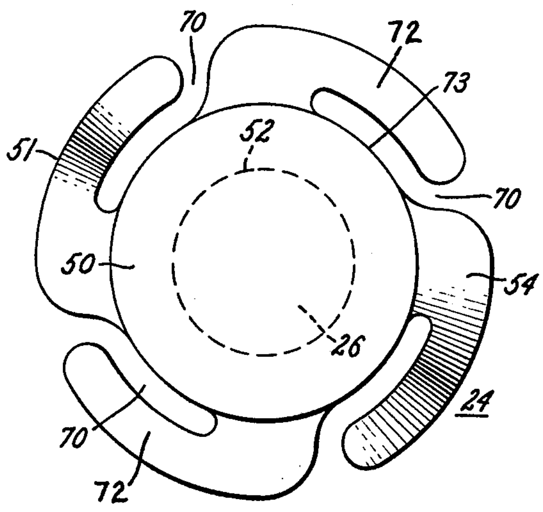
FIG. 3 is a sectional view along the line 3—3 of FIG. 2.

To encourage motion of the arc on the contact surfaces, particularly when the arc loses some of its above-described diffuseness, a plurality of arc-revolving slots 70 are provided in the outer region of each contact, as best seen in FIG. 3. Each of these slots 70 extends from the outer periphery 51 of the contact generally radially inwardly for a short distance and then circumferentially of the contact for about 50°. These slots are intended to operate in generally the manner described in my U.S. Pat. No. 3,522,399, assigned to the assignee of the present invention. These slots 70 divide the contact into circumferentially-extending fingers 72 located radially outwardly of the slots. The perimeter of the flat central surface 50 is located at and substantially coincides with the inner edge 73 of the slots 70. The diameter of the flat central surface 50 is about two-thirds that of the overall disc-shaped contact.

In order to minimize the reduction in contact thickness resulting from erosion by inter-contact arcs, it is desirable that the flat surface 50 of each contact have as large an area as possible. To this end, it is highly desirable that the surface 50 not be significantly penetrated by the arc-revolving slots 70. Accordingly, the radially-inner edge 73 of each slot 70 is of an arcuate form, is disposed on a reference circle substantially concentric with the outer periphery 51 of the contact, and does not extend radially inwardly of the perimeter of the flat surface 50, all as shown in FIG. 2. The slots resulting from this relationship consume a near-minimum amount of contact space considered radially of the contact, leave the flat central region 50 intact, and yet provide adequate arc-revolving ability for the required high-current interrupting duty.

Each slot 70 is preferably formed by machining the blank 65 with a rotating milling tool, the rotational axis of which is moved along the center line of the slot during machining. The simple slot configuration facilitates such machining, enabling most of the machining to be performed along a constant radius path with respect to the center of the contact.

While I have shown and described a particular embodiment of my invention, it will be obvious to those skilled in the art that various changes and modifications may be made without departing from my invention in its broader aspects; and I, therefore, intend herein to cover all such changes and modifications as fall within the true spirit and scope of my invention.

What I claim as new and desire to secure by Letters Patent of the United States is:

1. A vacuum-type circuit interrupter rated to interrupt alternating currents of 35,000 amperes r.m.s. or higher with any degree of asymmetry up to 1.3, comprising:

a. a highly evacuated envelope, b. a pair of conductive contact rods having their inner ends within said envelope, c. a pair of thin disc-shaped contacts primarily of beryllium respectively mounted on the inner ends of said contact rods, at least one of said contacts comprising:

c(1) a central region with a substantially flat surface primarily of beryllium facing the other contact and located in a predetermined reference plane for engaging the other contact, said flat surface extending radially from the center of said contact to a perimeter located radially between the outer periphery of said contact and the outer periphery of the inner end of the associated contact rod, c(2) an outer region having a surface facing the other contact and extending between said perimeter and the outer periphery of said disc-shaped contact, said outer-region surface being located behind said reference plane so that no contact-engagement normally occurs thereon, and d. said interrupter being free of structure interposed between said contacts.

2. The vacuum interrupter of claim 1 in which both of said contacts are constructed as defined in claim 1.

3. The vacuum interrupter of claim 1 in which said one contact is joined to the inner end of its associated contact rod by means of a brazed joint, the back surface of said one contact having a shallow recess therein accommodating a portion of said joint.

4. The vacuum interrupter of claim 2 in which both said contacts are joined to the inner ends of their associated contact rods by means of brazed joints, the back surface of each contact having a shallow recess therein accommodating a portion of the associated joint.

5. The vacuum interrupter of claim 1 in which said surface of said outer region is bevelled and inclined with respect to said reference plane.

6. The vacuum interrupter of claim 1 in which the perimeter of said flat surface has a diameter of about two-thirds that of said disc-shaped contact.

7. The vacuum interrupter of claim 1 in which each of said contacts is formed from an ingot cast in an inert environment, which ingot has been subjected to hot working, said beryllium having a microstructure characterized by grain boundaries that are substantially free of oxide coating on the interfaces between the grains.

8. The vacuum interrupter of claim 3 in which said brazed joint comprises a shim primarily of silver fitted within said shallow recess and silver-base brazing material substantially filling the space in said recess between said shim and the recess surface.

9. The vacuum interrupter of claim 1 in which said outer region of each contact contains slots, each extending from the outer periphery of said contact for a short distance radially inwardly and then circumferentially of the contact, each of said slots having a radially-inner edge of arcuate form disposed on a reference circle substantially concentric with the outer periphery of the contact, said edge not extending radially inwardly of said perimeter of said flat surface.

10. The vacuum interrupter of claim 9 in which said reference circle substantially coincides with said perimeter of said flat surface.

11. A vacuum-type circuit interrupter as defined in claim 1 and in which arcing occurs over substantially the entire surface of each contact that faces the other contact.

12. A vacuum-type circuit interrupter as defined in claim 2 and in which arcing occurs over substantially the entire surface of each contact that faces the other contact.

* * * * *